(12) United States Patent
Moon et al.

(10) Patent No.: US 9,778,290 B2
(45) Date of Patent: Oct. 3, 2017

(54) BRANCH CURRENT MONITOR WITH RECONFIGURATION

(71) Applicant: Veris Industries, LLC, Tualatin, OR (US)

(72) Inventors: Eric Moon, Sherwood, OR (US); Michael Bitsch, Hillsboro, OR (US)

(73) Assignee: Veris Industries, LLC, Tualatin, OR (US)

( * ) Notice: Subject to any disclaimer, the term of this patent is extended or adjusted under 35 U.S.C. 154(b) by 0 days.

(21) Appl. No.: 15/185,677

(22) Filed: Jun. 17, 2016

(65) Prior Publication Data

US 2017/0184638 A1   Jun. 29, 2017

Related U.S. Application Data

(60) Provisional application No. 62/271,402, filed on Dec. 28, 2015.

(51) Int. Cl.
| | |
|---|---|
| *G01R 19/00* | (2006.01) |
| *G01R 27/08* | (2006.01) |
| *G01R 31/36* | (2006.01) |
| *G01R 21/06* | (2006.01) |
| *G01R 17/12* | (2006.01) |

(52) U.S. Cl.
CPC ......... *G01R 19/0092* (2013.01); *G01R 19/00* (2013.01); *G01R 21/06* (2013.01); *G01R 31/3606* (2013.01); *G01R 17/12* (2013.01); *G01R 19/0084* (2013.01); *G01R 27/08* (2013.01)

(58) Field of Classification Search
CPC   G01R 19/00; G01R 19/0084; G01R 19/0092; G01R 19/14; G01R 19/145; G01R 19/15; G01R 19/155; G01R 19/165; G01R 15/12; G01R 15/146; G01R 17/12; G01R 21/00; G01R 21/06; G01R 27/00; G01R 27/02; G01R 27/08; G01R 31/00; G01R 31/3606; G01R 31/3624
USPC ............. 324/76.11, 522, 713; 702/1, 57, 64
See application file for complete search history.

(56) References Cited

U.S. PATENT DOCUMENTS

| | | | | | |
|---|---|---|---|---|---|
| 5,629,545 | A | * | 5/1997 | Leach | H01L 27/0251 257/357 |
| 6,087,839 | A | * | 7/2000 | Choi | G01R 31/2806 324/763.01 |
| 8,610,438 | B1 | * | 12/2013 | Sykora | G01R 15/183 307/64 |
| 9,304,152 | B2 | * | 4/2016 | Aerts | G01R 19/0092 |
| 2015/0236583 | A1 | * | 8/2015 | Ripley | H02M 3/06 323/234 |

\* cited by examiner

*Primary Examiner* — Hoai-An D Nguyen
(74) *Attorney, Agent, or Firm* — Chernoff Vilhauer McClung & Stenzel, LLP

(57) ABSTRACT

A branch current monitor that includes reconfiguration.

21 Claims, 16 Drawing Sheets

BRANCH CURRENT MONITOR WITH RECONFIGURATION

CROSS-REFERENCE TO RELATED APPLICATIONS

This application claims the benefit of U.S. Provisional App. No. 62/271,402, filed Dec. 28, 2015.

BACKGROUND OF THE INVENTION

The present invention relates to a branch current monitor and, more particularly, to a system for reconfiguring a branch current monitor.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Flexibility has favored adoption of digital branch current monitors incorporating data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While physical installation of the branch current monitor is simplified by mounting the branch circuit current transformers on common supports, system commissioning can be complicated. After the monitor's hardware is installed in the power distribution panel, the panel's hardware and electrical connections are made, it is difficult to identify whether the data accurately reflects the particular circuit.

What is desired, therefore, is a simplified system for reconfiguring a branch current monitor in the event of an error in the installation and/or the configuration.

DETAILED DESCRIPTION OF PREFERRED EMBODIMENTS

Figure 1:
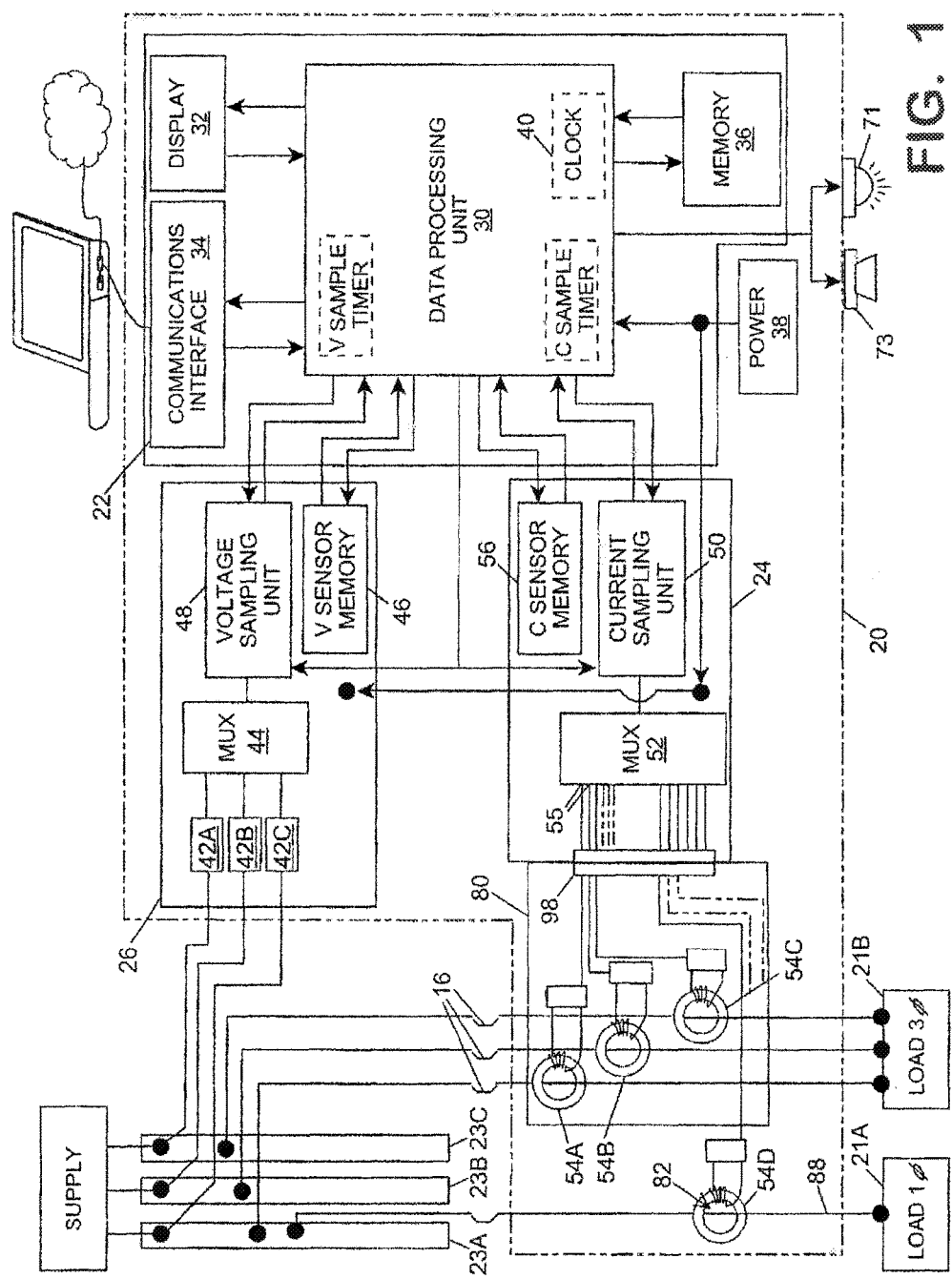
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
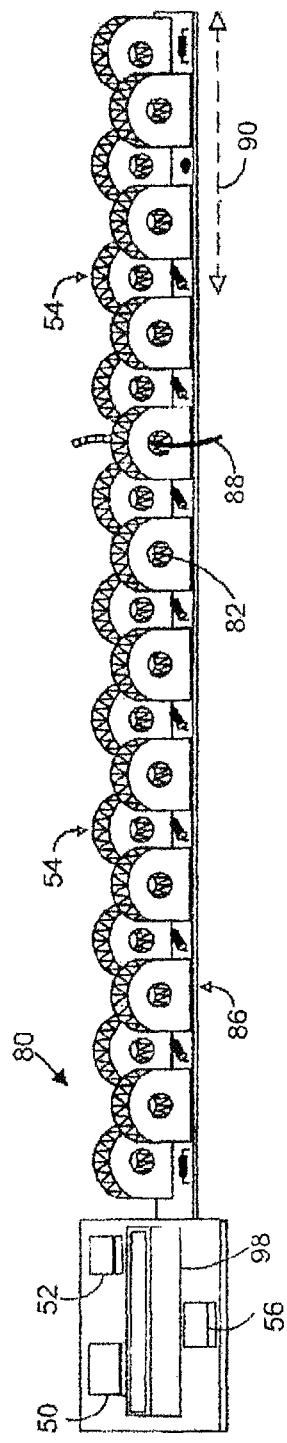
FIG. 2 is a perspective view of a current transformer strip for a branch current monitor.
Figure 3:
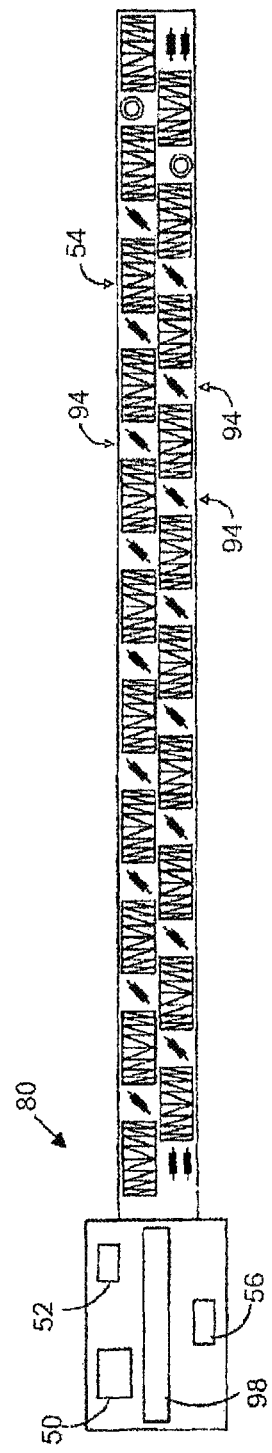
FIG. 3 is a top view of the current transformer strip of FIG. 2.
Figure 4:
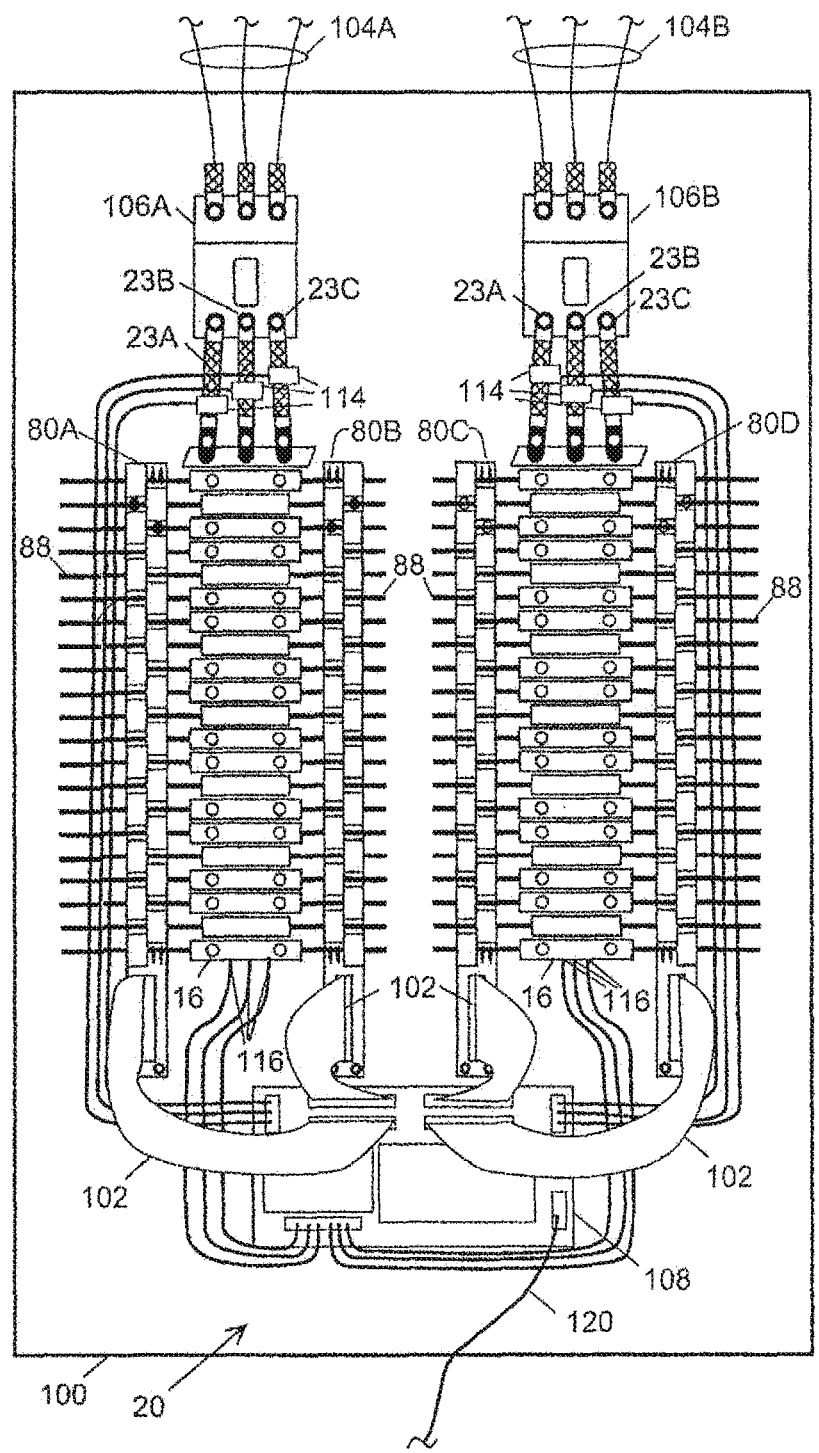
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. In some embodiments, the current transformers may be split core. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
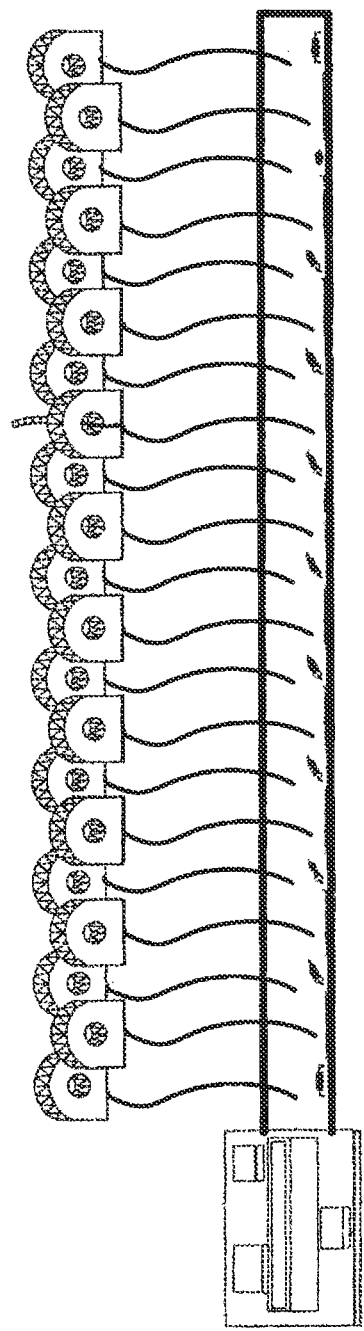
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board.

Figure 6:
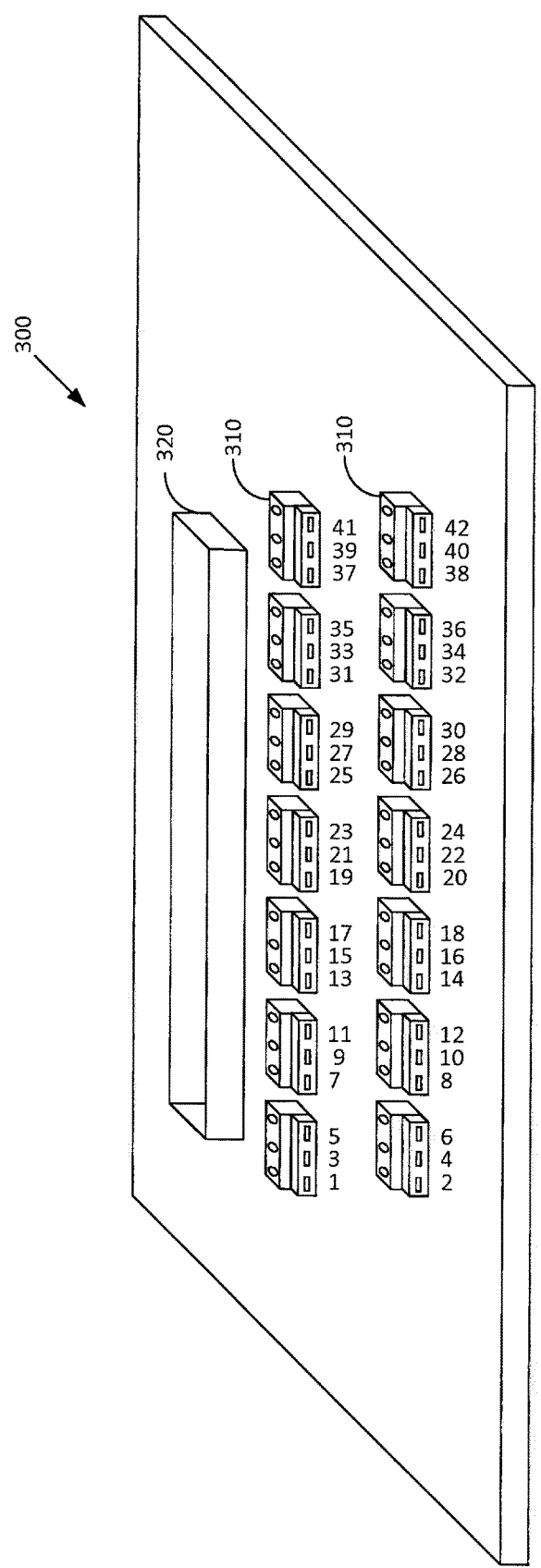
FIG. 6 illustrates a view of a connector board for a branch current monitor.

Referring to FIG. 6, another embodiment includes a set of one or more connector boards 300 in addition to or as an alternative to the strip units. Each of the connector boards may include a set of connectors 310 that may be used to interconnect a current transformer thereto. Each of the connector boards may include a connector 320 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B.

Figure 7:
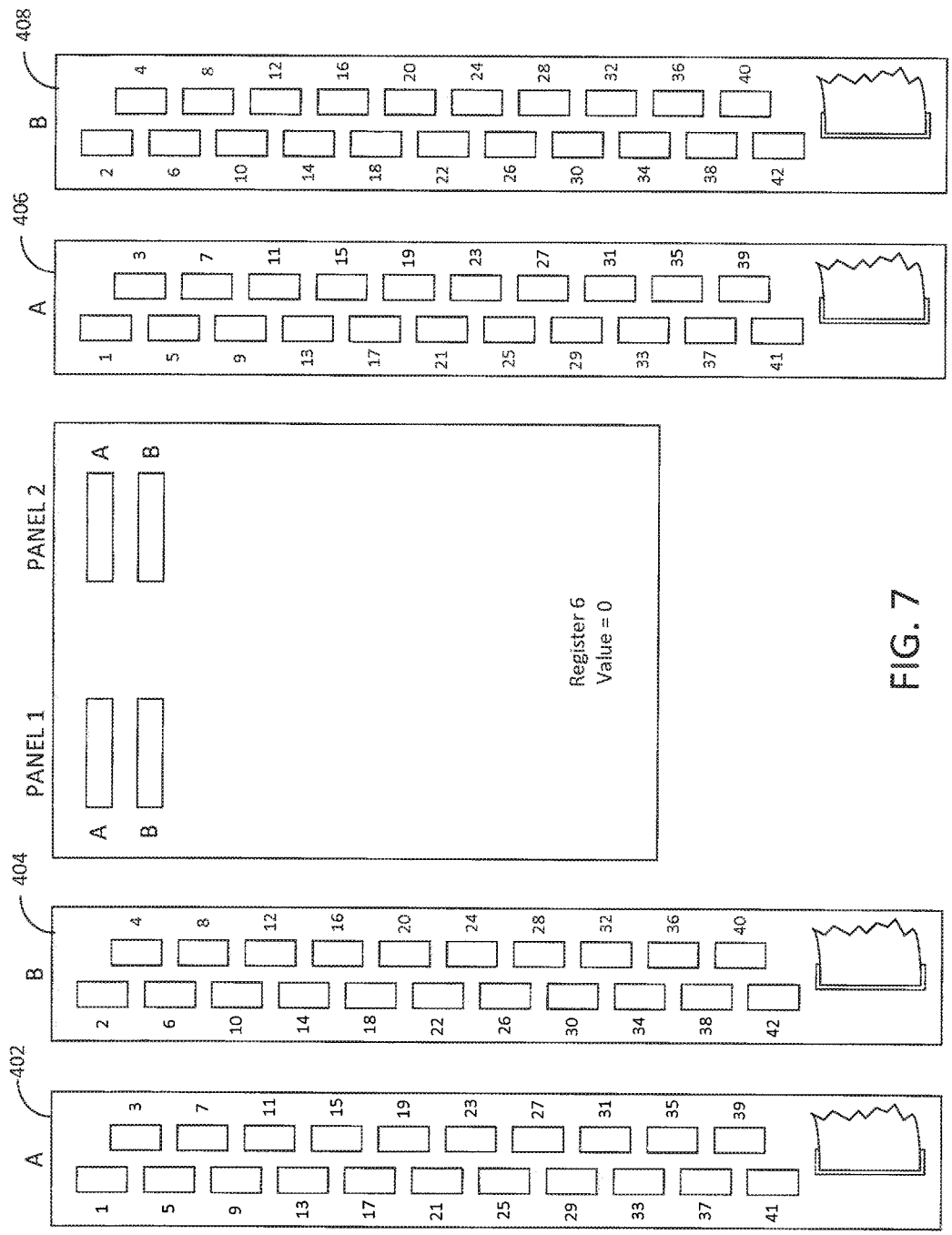
FIG. 7 illustrates a top feed configuration.

Referring to FIG. 7, in one embodiment the strip units 402, 404, 406, 408 may be configured in a parallel fashion with the connectors at the bottom, generally referred to as a top feed configuration.

Figure 8:
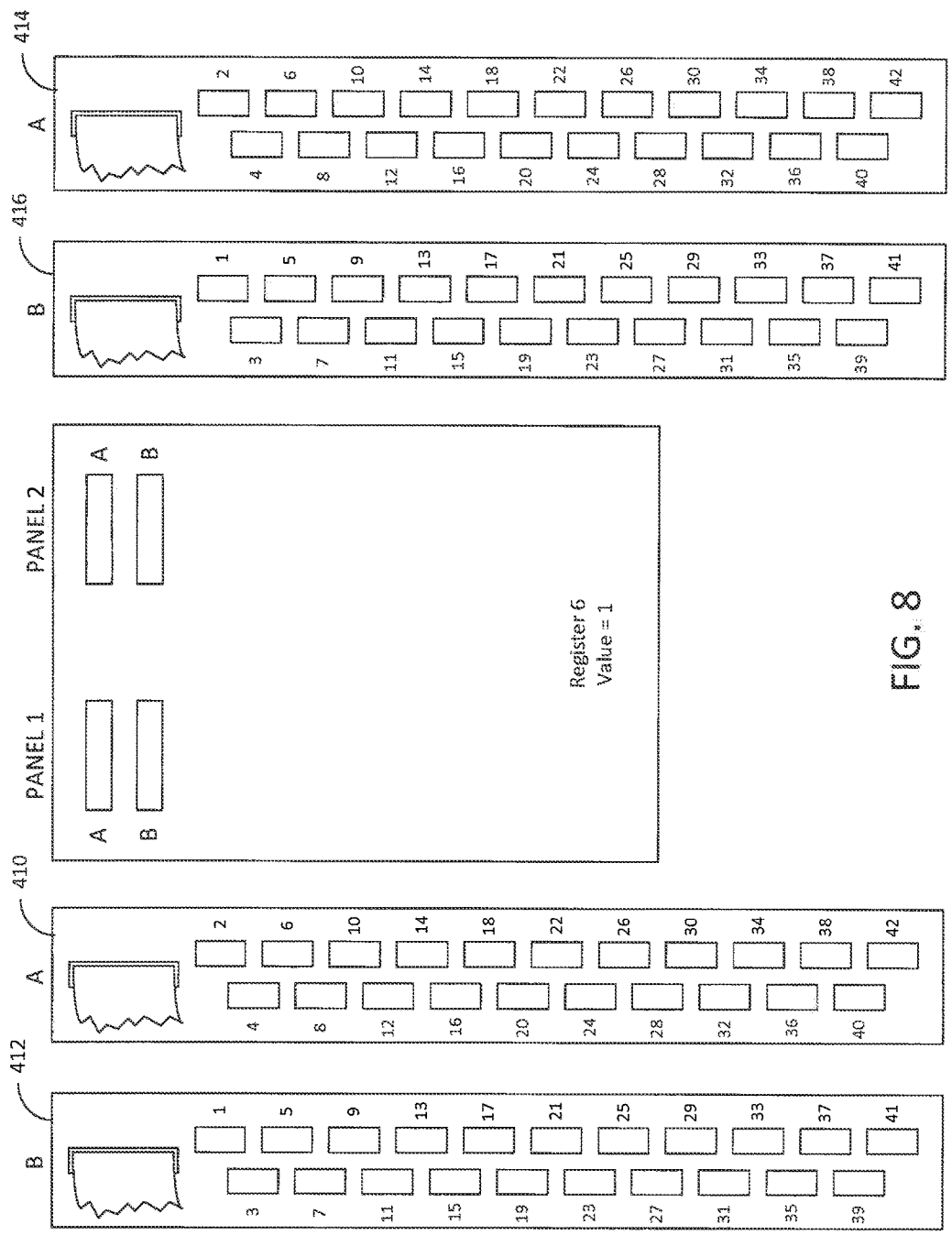
FIG. 8 illustrates a bottom feed configuration.

Referring to FIG. 8, in another embodiment the strip units 410, 412, 414, 416 may be configured in a parallel fashion with the connectors at the top, generally referred to as a bottom feed configuration.

Figure 9:
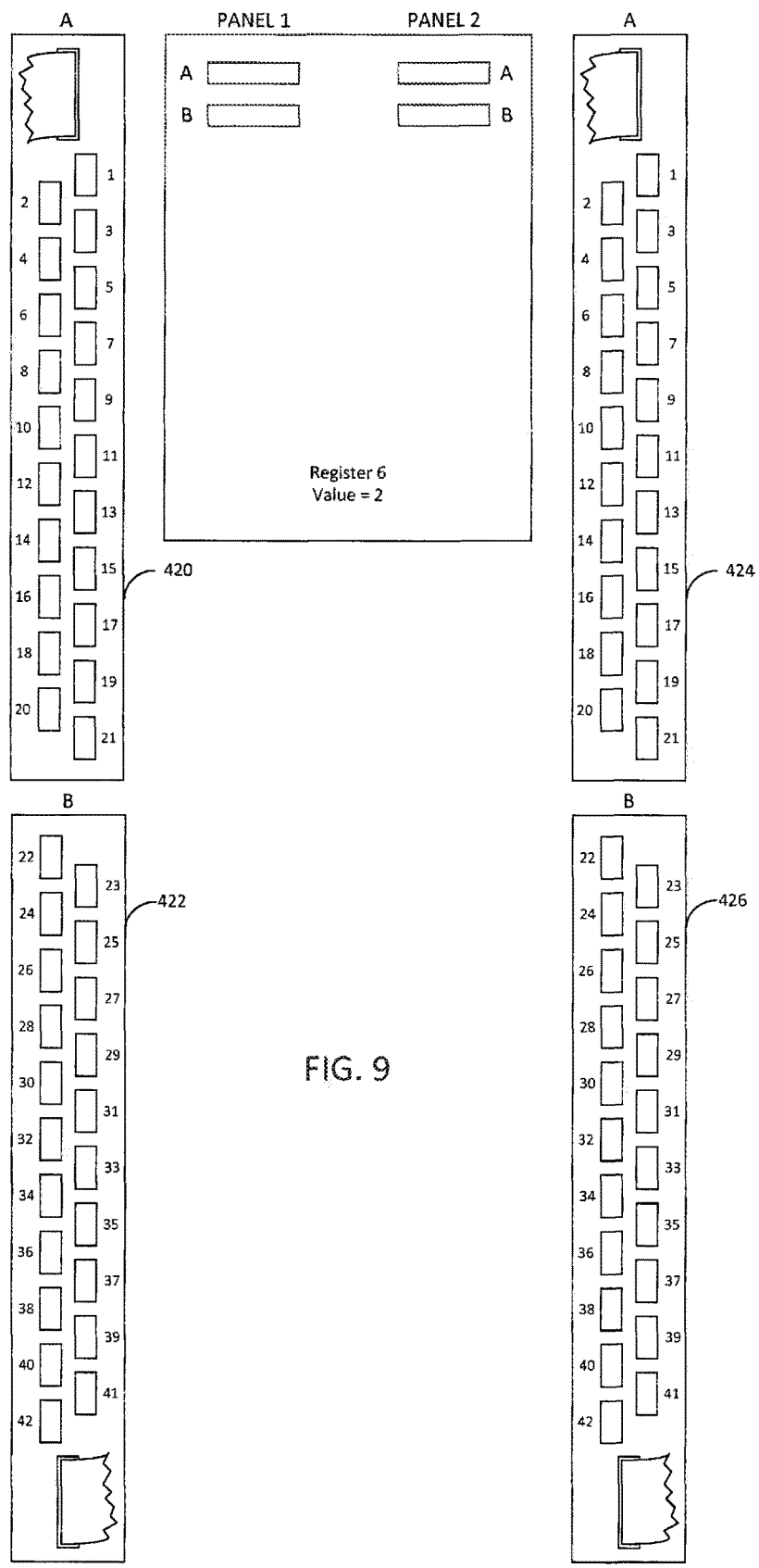
FIG. 9 illustrates a single row sequential configuration.

Referring to FIG. 9, in another embedment the strip units 420, 422, 424, 426 may be configured in a sequential fashion with the connectors at the top and the bottom, generally referred to as a single row sequential configuration.

Figure 10:
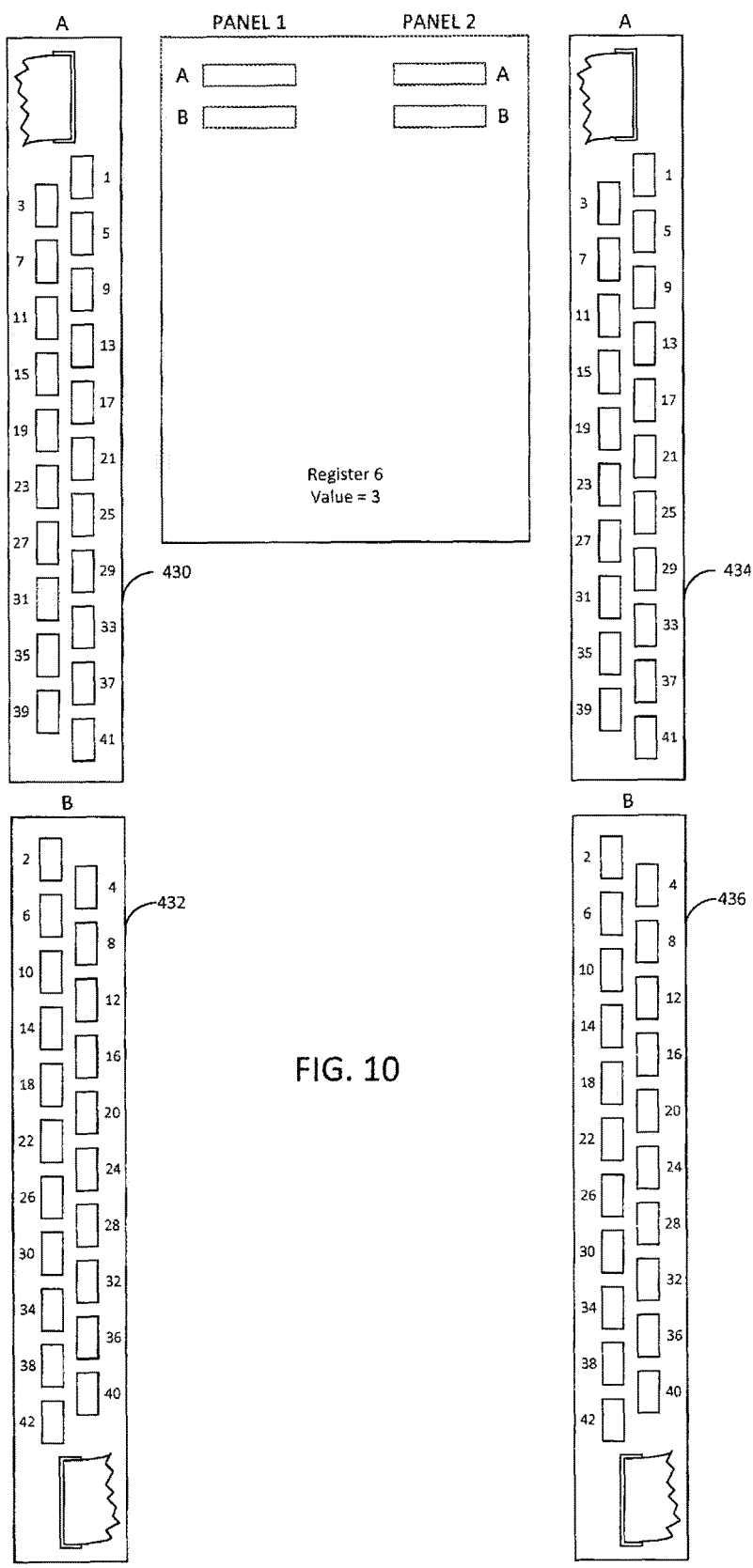
FIG. 10 illustrates a single odd/even configuration.

Referring to FIG. 10, in another embodiment the strip units 430, 432, 434, 436 may be configured in a single row with odd/even fashion with the connectors at the top and the bottom, generally referred to as a single row odd/even configuration.

In many cases, each of the strip units may include a numbered identification of each of the current transformers, such as 1 through 21 and/or 22 through 42 and/or 1 through 41 odd and/or 2 through 42 even. All of the strip units may include the same numbering, if desired. Alternatively, different ones of the strip units may include different numbering schemes, such as for example, odd and even numbering. Other numbering arrangements may likewise be used, as desired.

The strip units may include a different number of current transformers, if desired. Also, each of the strip units may include a different number of current transformers. Each of the strip units and connector boards may include a connector that is interchangeable with the other strip units and connector boards, and the circuit board likewise may include a plurality of connectors that will likewise accept a connection from all of the other strip units and connector boards. In this manner, any of the strip units and connector boards may be connected to any of the connectors on the circuit board. Preferably, each of the connectors for the strip units and/or connector boards on the circuit board are the same.

In another embodiment, the strip units and/or the connector boards may be daisy chained together using a first connector. A second connector may be used from one of the strip units and/or connector boards to the circuit board. Alternatively, a single connector may be used with a single wiring system, such as for example an Ethernet cable or strip wiring, for bidirectional communication. While the connection is preferably a generally flat strip cable, other types of connectors may likewise be used, such as an Ethernet cable.

A register, such as register 6, of the circuit board 108 may be set to a selected value to identify the configuration of the particular strip units and/or connector boards to the circuit board. In addition, the connectors on the strip units and/or connector boards may be connected to the appropriate connector on the circuit board so that signals may be provided to the circuit board and/or be received from the circuit board. For example, the board identified as A for panel 1 (left side) should be connected to the panel 1 connector identified as A. For example, the strip unit identified as B for panel 1 (left side) should be connected to the panel 1 connector identified as B. For example, the strip unit identified as A for panel 2 (right side) should be connected to the panel 2 connector identified as A. For example, the strip unit identified as B for panel 2 (right side) should be connected to the panel 2 connector identified as B. It tends to be problematic for the installers of the circuit board and/or the strip unit(s) and/or connector board(s) to properly configure and interconnect the circuit board for the desired configuration. For example, in some cases the installers may program the circuit board with an incorrect identification configuration. For example, the installers may reverse the direction of the strip units so that the connector is either at the top when it should be at the bottom, or the connector is at the bottom when it should be at the top. In some cases, the installer may install the improper even/odd labeled strip unit. In other cases, the installer may install the strip units with the lower numbers in the location intended for the higher numbers, and the strip units with the higher numbers in the location intended for the lower numbers. In some cases, the installer may connect the strip unit intended for the right side to the left side of the circuit board, and may connect the strip unit intended for the left side to the right side of the circuit board. With the strip unit and/or connector board, the installer typically slavishly follows connection instructions to install particular circuit breakers and/or wires to particular current transformers. Whether the strip unit is connected to the incorrect connector on the circuit board, and/or whether the incorrect strip unit is connected to a particular connector, and/or whether the strip unit is arranged in the incorrect orientation, the circuit board will associate the respective current sensors with a circuit that is different than is intended. Also, depending on the particular configuration of circuits, the circuit board may associate an improper set of three single phase signals from the current transformers as belonging to a three phase circuit. Moreover, depending on the particular installation the wiring may be difficult to trace from the current sensors to the strip unit and/or connector board to the circuit board. Accordingly, the circuit board may result in current sensor measurements that are associated with the incorrect loads.

Figure 11:
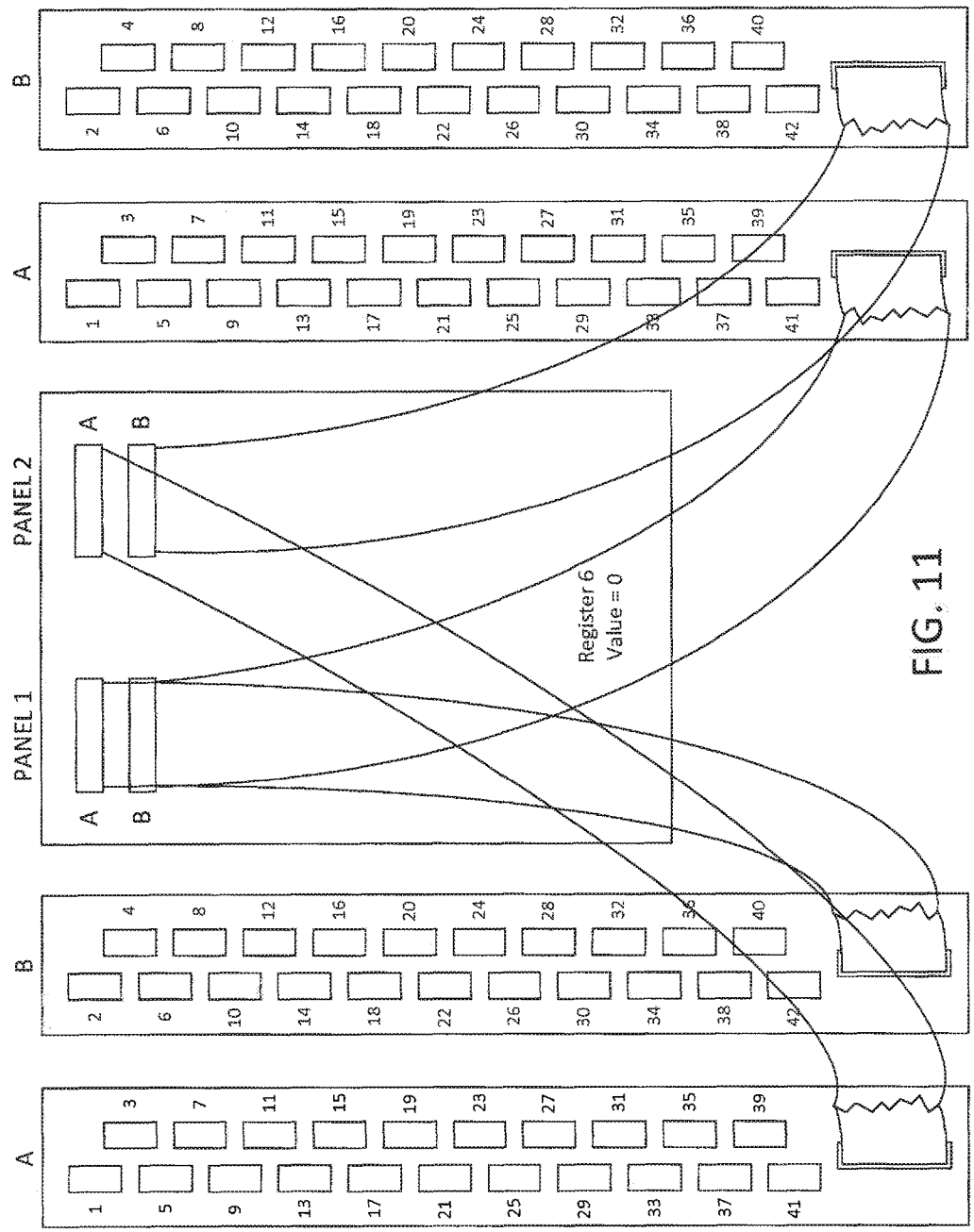
FIG. 11 illustrates a top feed configuration improperly interconnected.

Referring to FIG. 11, an exemplary incorrect interconnection is illustrated. One of the strip units that was intended for panel 1 is connected to pane 2 and one of the strip units that was intended for panel 2 is connected to panel 1. In addition, the connector boards for phase A and phase B have been connected in swapped locations on panel 1. As previously described, to the system the sensing of currents, voltages, determining power usage and other measurements may seem to be correct since each of the circuits may be providing data, but in fact it is providing data that is associated with the wrong physical circuit.

Figure 12:
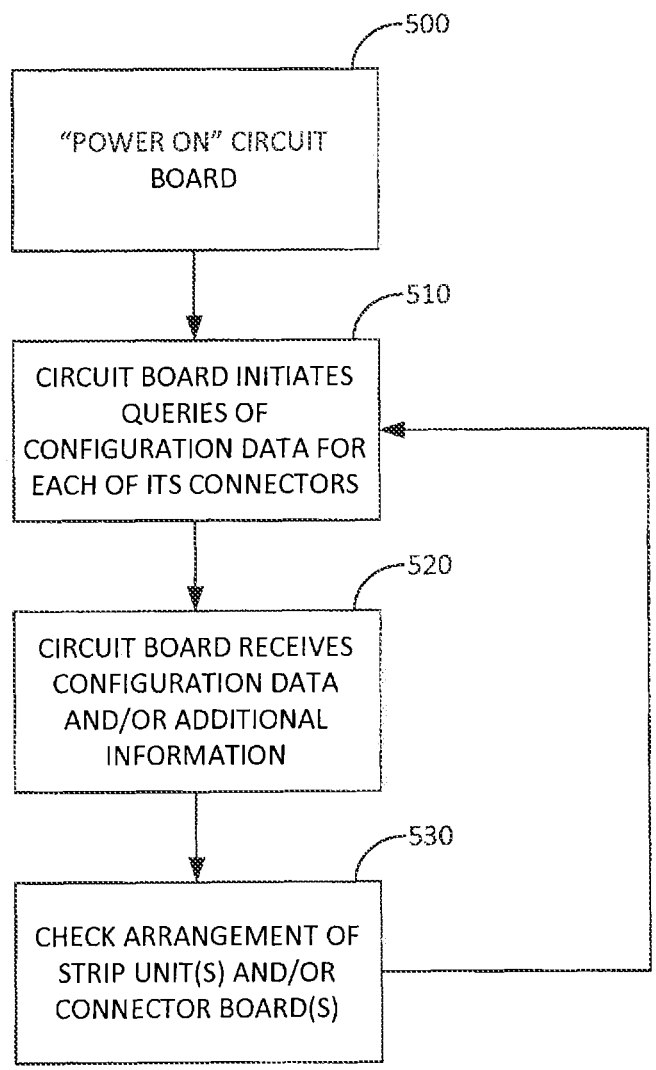
FIG. 12 illustrates strip unit and/or circuit board identification.

Referring to FIG. 12, upon "power on" the circuit board may perform a query of the system and those devices connected by the connectors. After the circuit board being powered on 500, the circuit board may initiate queries of configuration data for each of its connectors 510. In this manner, the circuit board may determine different types of configuration data related to the strip units and/or connector boards, such as the number of current sensors, the arrangement of the current sensors, the type of current sensors, the calibration of the current sensors, etc. While such electrical characteristic related and physical configuration related configuration data may be useful, additional information regarding the intended panel of the circuit board the strip unit and/or connector board is intended to be connected to may be determined 520. While such electrical characteristic related and physical configuration related configuration data may be useful, additional information regarding the intended circuit of the circuit board the strip unit and/or connector board is intended to be connected to, such as circuit A or circuit B may be determined 520. Preferably the additional information may be related to identifying the screen printing of the circuit numbering on the strip unit and/or connector board. For example, the additional information may identify a strip unit with an odd numbered configuration, namely, 1, 3, 5, 7, 9, . . . , 39, 41. For example, the additional information may identify a strip unit with an even configuration, namely, 2, 4, 6, 8, 10, . . . , 40, 42. For example, the additional information may identify a strip unit with a sequential numbered configuration, namely, 1, 2, 3, 4, 5, . . . , 20, 21. For example, the additional information may identify a strip unit with a sequential numbered configuration, namely, 22, 23, 24, 25, 26, . . . , 41, 42. The configuration data and/or additional information may be provided by the strip unit and/or connector board or the nature of the termination of one or more connectors of one or more pins of the connector may be used to identify such information. For example, one or more pins may be provided with different terminations on the strip unit and/or connector board to identify such information.

The circuit board receives the configuration data and/or the additional information for each of the strip units and/or connector boards. The circuit board may then check the arrangement of strip units and/or connector boards to be consistent with the intended configuration, as indicated by configuration data on the circuit board.

Figure 13:
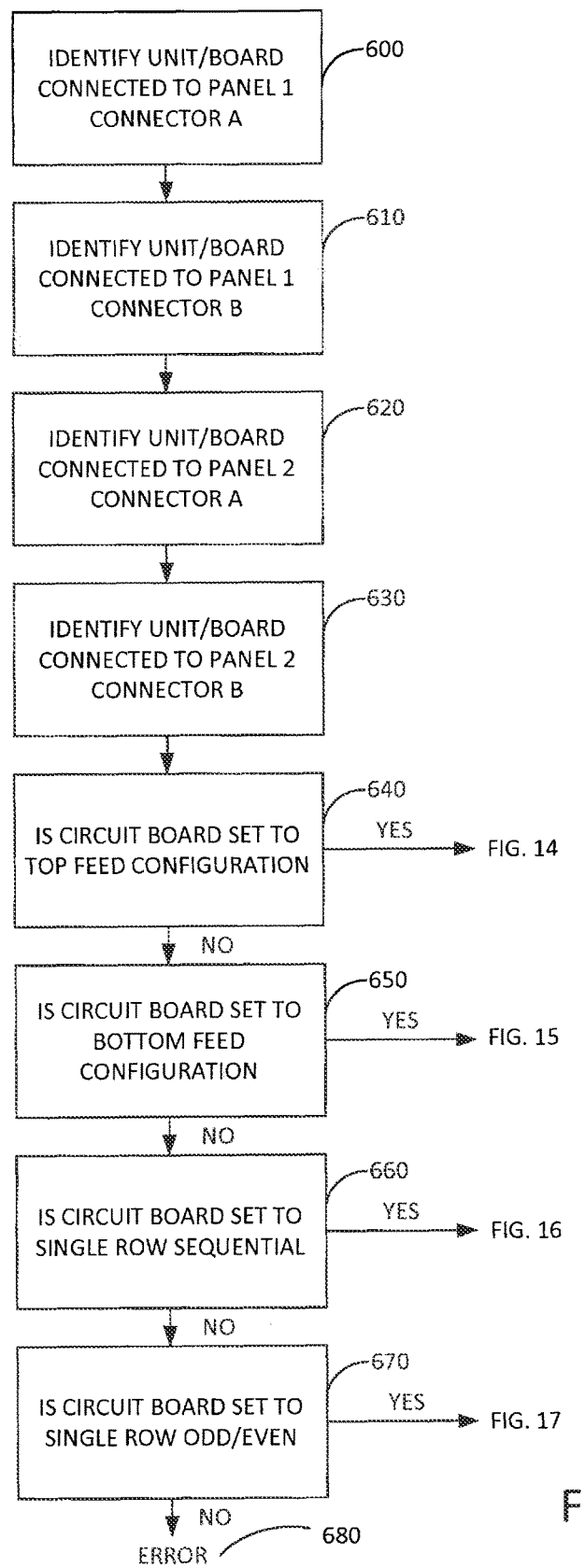
FIG. 13 illustrates strip unit and/or circuit board configuration.
Figure 14:
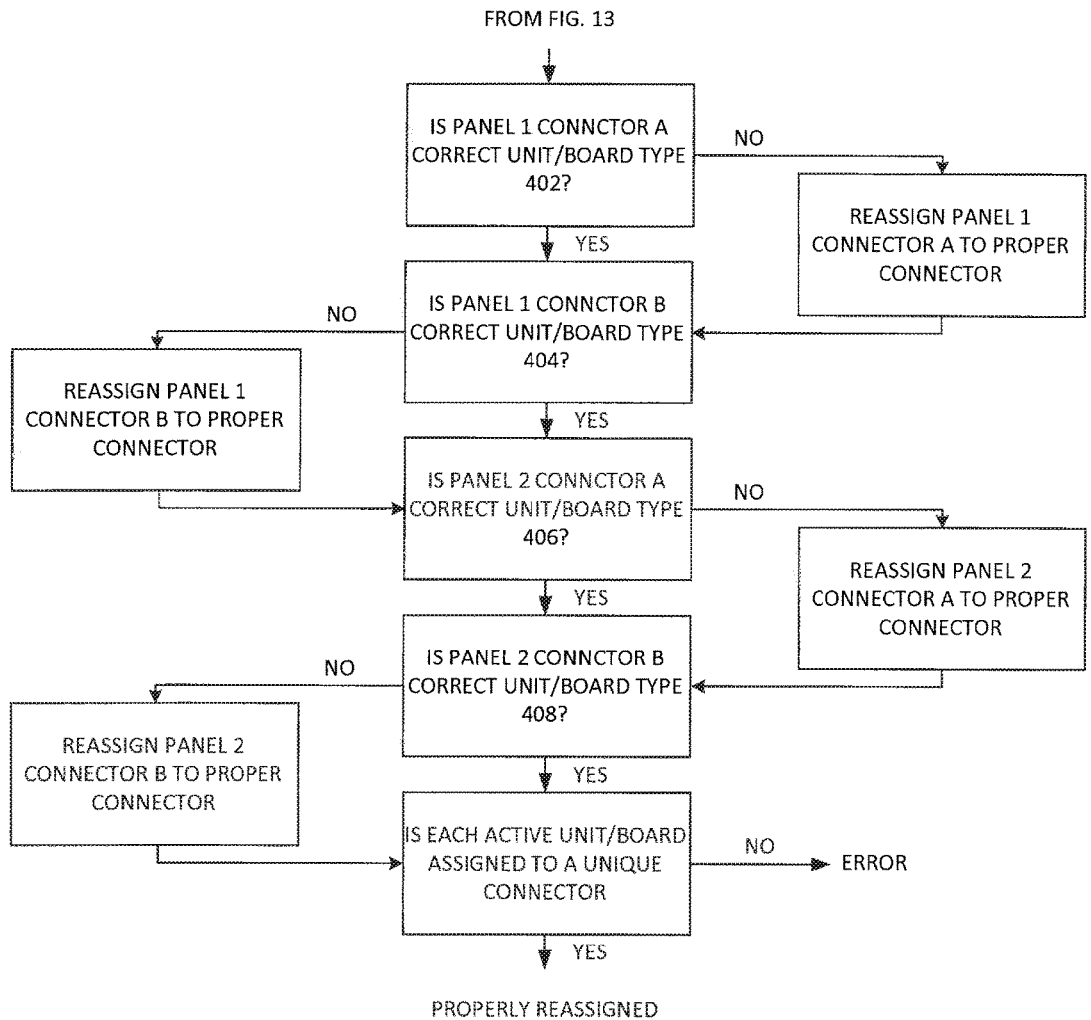
FIG. 14 illustrates top feed re-configuration.
Figure 15:
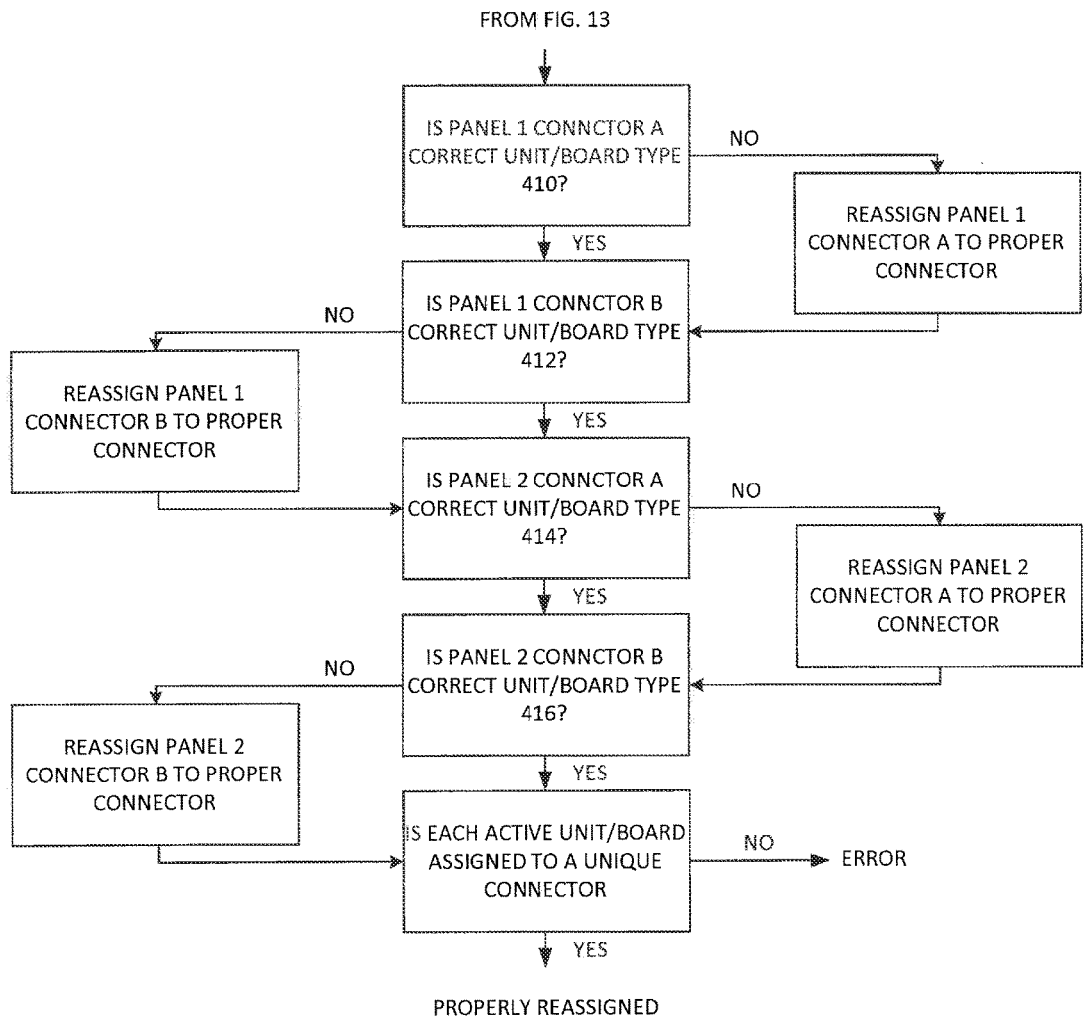
FIG. 15 illustrates bottom feed re-configuration.
Figure 16:
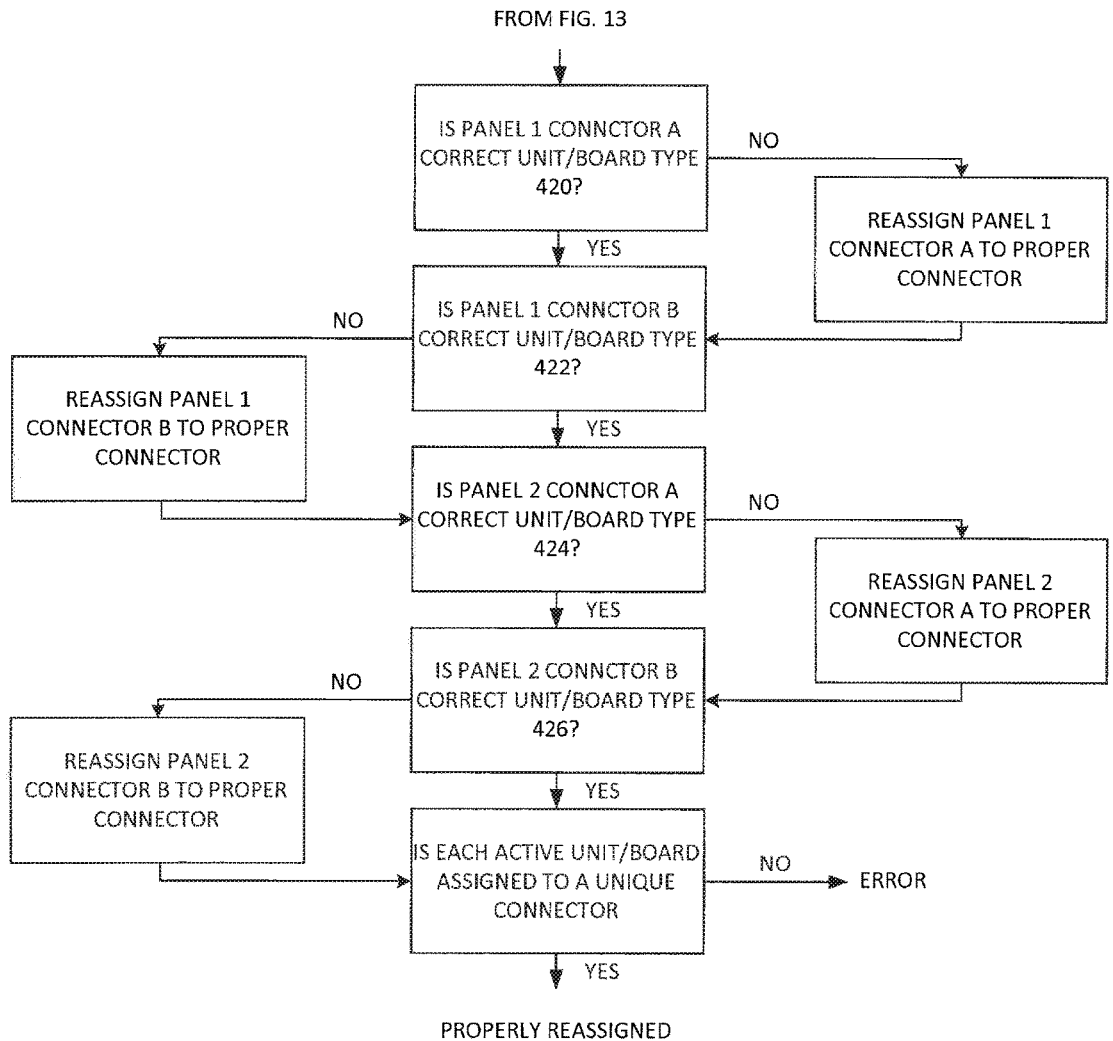
FIG. 16 illustrates single row sequential reconfiguration.
Figure 17:
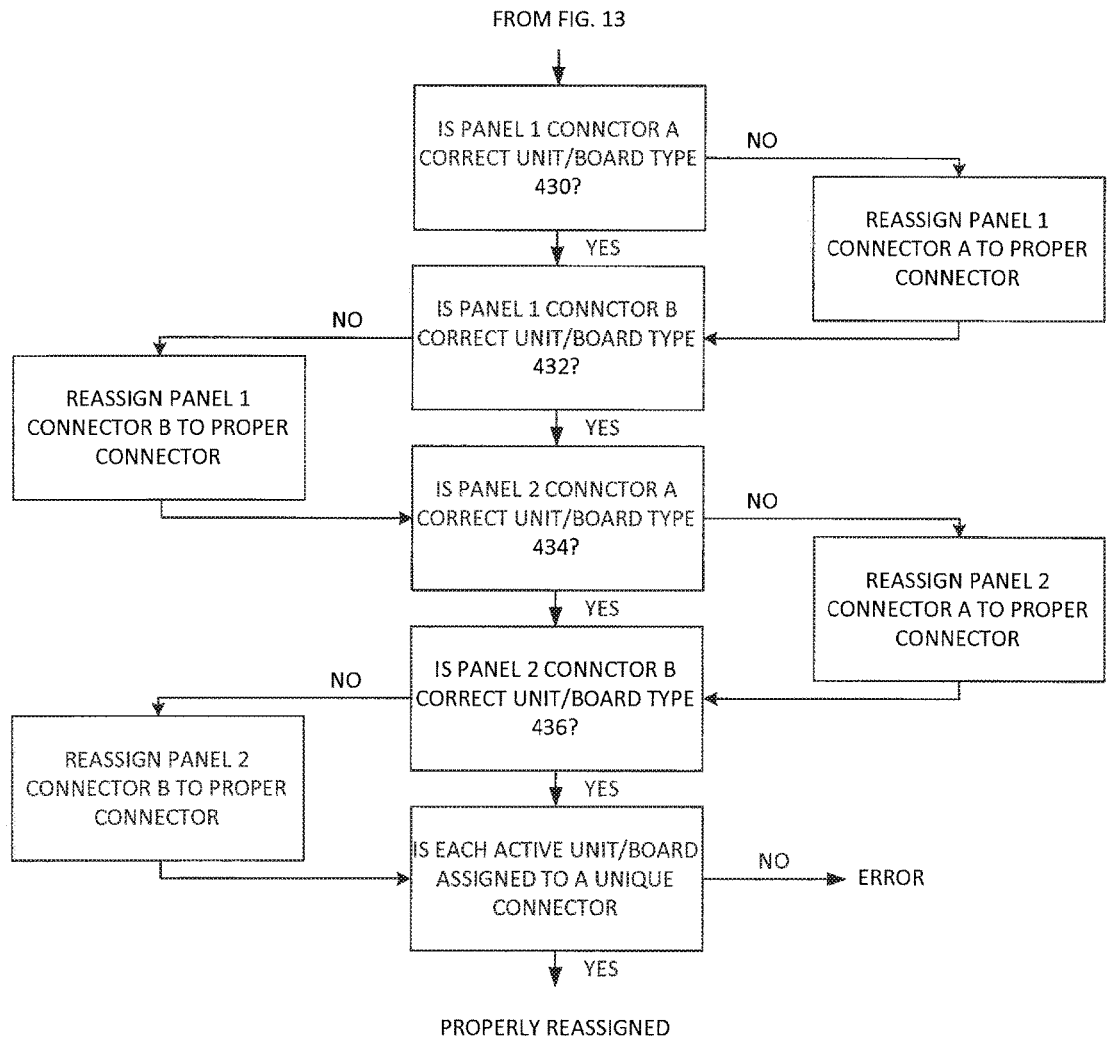
FIG. 17 illustrates single row odd/even reconfiguration.

Referring to FIG. 13, the system may first identify the strip unit/connector board connected to panel 1 connector A 600, then the system may identify the strip unit/connector board connected to panel 1 connector B 610, then the system may identify the strip unit/connector board connected to panel 2 connector A 620, and the system may identify the strip unit/connector board connected to panel 2 connector B 630. With each of the strip unit(s) and/or connector board(s) connected to any active connector identified, the system may validate the connection of the units/boards to the circuit board based on the identified configuration of the system. If the circuit board is set to the top feed configuration 640 then system validates that configuration, as illustrated in FIG. 14. If the circuit board is set to the bottom feed configuration 650 then system validates that configuration, as illustrated in FIG. 15. If the circuit board is set to the single row sequential configuration 660 then system validates that configuration, as illustrated in FIG. 16. If the circuit board is set to single row odd/even configuration 670 then system validates that configuration, as illustrated in FIG. 17. If the system is not set to one of these configurations, then an error condition 680 may be signaled. Other configurations may likewise be validated, as desired.

Referring to FIG. 14, when the circuit board indicates a top feed configuration, the circuit board may check whether panel 1 connector A has the correct unit type 402 If it does not, then the system may reassign the signals from panel 1 connector A to the proper connector. The circuit board may then check whether panel 1 connector B has the correct unit type 404 If it does not, then the system may reassign the signals from panel 1 connector B to the proper connector. The circuit board may then check whether panel 2 connector A has the correct unit type 406 If it does not, then the system may reassign the signals from panel 2 connector A to the proper connector. The circuit board may then check whether panel 2 connector B has the correct unit type 408 If it does not, then the system may reassign the signals from panel 2 connector B to the proper connector. The system may also check that each active unit is assigned to a unique connector, to confirm that two different units are not assigned to the same connector and that each connector is assigned to a unique connector. If each active unit is assigned to a unique connector then the connector board has suitably reassigned the connectors in a manner that overcomes an inadvertent installation error by the installer, otherwise an error condition may be signaled.

Referring to FIG. 15, when the circuit board indicates a bottom feed configuration, the circuit board may check whether panel 1 connector A has the correct unit type 410 If it does not, then the system may reassign the signals from panel 1 connector A to the proper connector. The circuit board may then check whether panel 1 connector B has the correct unit type 412 If it does not, then the system may reassign the signals from panel 1 connector B to the proper connector. The circuit board may then check whether panel 2 connector A has the correct unit type 414 If it does not, then the system may reassign the signals from panel 2 connector A to the proper connector. The circuit board may then check whether panel 2 connector B has the correct unit type 416 If it does not, then the system may reassign the signals from panel 2 connector B to the proper connector. The system may also check that each active unit is assigned to a unique connector, to confirm that two different units are not assigned to the same connector and that each connector is assigned to a connector. If each active unit is assigned to a unique connector then the connector board has suitably reassigned the connectors in a manner that overcomes an inadvertent installation error by the installer, otherwise an error condition may be signaled.

Referring to FIG. 16, when the circuit board indicates a single row sequential configuration, the circuit board may check whether panel 1 connector A has the correct unit type 420 If it does not, then the system may reassign the signals from panel 1 connector A to the proper connector. The circuit board may then check whether panel 1 connector B has the correct unit type 422 If it does not, then the system may reassign the signals from panel 1 connector B to the proper connector. The circuit board may then check whether panel 2 connector A has the correct unit type 424 If it does not, then the system may reassign the signals from panel 2 connector A to the proper connector. The circuit board may then check whether panel 2 connector B has the correct unit type 426 If it does not, then the system may reassign the signals from panel 2 connector B to the proper connector. The system may also check that each active unit is assigned to a unique connector, to confirm that two different units are not assigned to the same connector and that each connector is assigned to a connector. If each active unit is assigned to a unique connector then the connector board has suitably reassigned the connectors in a manner that overcomes an inadvertent installation error by the installer, otherwise an error condition may be signaled.

Referring to FIG. 17, when the circuit board indicates a single row odd/even configuration, the circuit board may check whether panel 1 connector A has the correct unit type 430 If it does not, then the system may reassign the signals from panel 1 connector A to the proper connector. The circuit board may then check whether panel 1 connector B has the correct unit type 432 If it does not, then the system may reassign the signals from panel 1 connector B to the proper connector. The circuit board may then check whether panel 2 connector A has the correct unit type 434 If it does not, then the system may reassign the signals from panel 2 connector A to the proper connector. The circuit board may then check whether panel 2 connector B has the correct unit type 436 If it does not, then the system may reassign the signals from panel 2 connector B to the proper connector. The system may also check that each active unit is assigned to a unique connector, to confirm that two different units are not assigned to the same connector and that each connector is assigned to a connector. If each active unit is assigned to a unique connector then the connector board has suitably reassigned the connectors in a manner that overcomes an inadvertent installation error by the installer, otherwise an error condition may be signaled.

In some embodiments, the strip units and the connector boards may not include a numbering of the current sensors, but rather the numbering scheme is identifiable by the circuit board in some manner.

In some embodiments, the strip units and the connector boards may include a numbering of the current sensors in a manner proximate some or all of the respective current sensors.

In some embodiments, the strip units and the connector boards may include a numbering of the current sensors in a manner that indicates the organization of the numbering of the current sensors, such as a graphical numbering illustration near the corner thereof or the connector.

In some embodiments, the strip units and the connector boards may include a numbering of the current sensors in a manner affixed to the current sensors themselves.

In some embodiments, the strip units and the connector boards may include a numbering of the current sensors with a detachable member, such as a paper strip, that may be readily removed before or after installation.

The system may, rather than automatically reassigning the strip units and/or the connector boards, may provide a signal to the user such as through a user interface or otherwise an observable signal. Based upon the signal the user may elect to permit the system to automatically reassign the inputs.

The system may periodically automatically, or upon a user selection, confirm the arrangement of the strip units and/or circuit boards that they are in a suitable configuration. In this manner, the system may update its configuration in the event the interconnections have changed.

In some embodiments, while the same number of available pins may be provided with the connector to maintain flexibility, the strip units and/or connector boards may include a fewer number of current sensors than that which may be signaled using the available pins. In this case, there may be fewer than the total number of active circuits, which is typically the case when the current strip and/or connector board has a limited number of current sensors interconnected thereto or otherwise a fewer number of current sensors than other configurations (e.g., 21 circuits, 18 circuits, 12 circuits). Often there is no data on those pins which are not associated with a current sensor. The system may further confirm the anticipated configuration, such as the number of active circuits, by confirming that the data is only being provided on the anticipated pins. This type of verification of the configuration may also be achieved using Ethernet cables and other types of cables where pins and/or addresses are verified for only anticipated circuits.

If desired, the circuit board may omit providing registers for those circuits that are not available for a particular configuration. In this manner, the system does not inadvertently provided a zero value or a null value for those circuits that are not available which could be considered as an open circuited condition.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A current monitoring system comprising:
   (a) a board that includes a first connector;
   (b) said board includes a second connector, where said first connector is suitable to detachably interconnect with either a first cable and a second cable, where said second connector is suitable to detachably interconnect with either said first cable and said second cable;
   (c) said first connector suitable for receiving sensor data from said first cable electrically connected to said first connector representative of current levels of a first plurality of current sensors electrically interconnected to a first support;
   (d) said second connector suitable for receiving sensor data from said second cable electrically connected to said second connector representative of current levels of a second plurality of current sensors electrically interconnected to a second support;
   (e) said first connector suitable for receiving first configuration data from said first cable;
   (f) said second connector suitable for receiving second configuration data from said second cable;
   (g) said current monitoring system having a configuration setting to characterize said first plurality of current sensors electrically connected to said first support and said second plurality of current sensors electrically interconnected to said second support;
   (h) said current monitoring system comparing said configuration setting with said first and second configuration data.

2. The current monitoring system of claim 1 wherein said current monitoring system comparing said configuration setting with said first and second configuration data determines whether said first support and said second support are properly configured.

3. The current monitoring system of claim 1 wherein said current monitoring system comparing said configuration setting with said first and second configuration data to determine whether said first support and said second support are in a top feed configuration.

4. The current monitoring system of claim 1 wherein said current monitoring system comparing said configuration setting with said first and second configuration data to determine whether said first support and said second support are in a bottom feed configuration.

5. The current monitoring system of claim 1 wherein said current monitoring system comparing said configuration setting with said first and second configuration data to determine whether said first support and said second support are in a single row sequential configuration.

6. The current monitoring system of claim 1 wherein said current monitoring system comparing said configuration setting with said first and second configuration data to determine whether said first support and said second support are in a single row odd/even configuration.

7. The current monitoring system of claim 1 wherein said configuration setting is based upon a register setting of said board.

8. The current monitoring system of claim 1 wherein said first configuration data indicates said first support having said first plurality of current sensors labeled in a linearly sequential manner of all odd numbers along the length of said first support.

9. The current monitoring system of claim 1 wherein said first configuration data indicates said first support having said first plurality of current sensors labeled in a linearly sequential manner of all even numbers along the length of said first support.

10. The current monitoring system of claim 1 wherein said first configuration data indicates said first support having said first plurality of current sensors labeled in a linearly sequential manner of all odd numbers along the length of said first support and said second configuration data indicates said second support having said second plurality of current sensors labeled in a linearly sequential manner of all even numbers along the length of said second support.

11. The current monitoring system of claim 10 wherein said first configuration data and said second configuration data indicates said first support and said second support are in a side by side arrangement.

12. The current monitoring system of claim 11 wherein said first configuration data and said second configuration data indicates said first support and said second support are in a top feed configuration.

13. The current monitoring system of claim 11 wherein said first configuration data and said second configuration data indicates said first support and said second support are in a bottom feed configuration.

14. The current monitoring system of claim 1 wherein said first configuration data indicates said first support having said first plurality of current sensors labeled in a linearly sequential manner of a first sequential set of numbers along the length of said first support.

15. The current monitoring system of claim 14 wherein said second configuration data indicates said second support having second first plurality of current sensors labeled in a linearly sequential manner of a second sequential set of numbers along the length of said second support that are different than said first set of sequential numbers.

16. The current monitoring system of claim 15 wherein said first configuration data and said second configuration data indicates said first support and said second support are in an end to end arrangement.

17. The current monitoring system of claim 16 wherein said first configuration data and said second configuration data indicates said first support and said second support are in a single row sequential configuration.

18. The current monitoring system of claim 1 wherein said first configuration data indicates said first support having said first plurality of current sensors labeled in a linearly sequential manner of a first sequential set of odd numbers along the length of said first support.

19. The current monitoring system of claim 18 wherein said second configuration data indicates said second support having second first plurality of current sensors labeled in a linearly sequential manner of a second sequential set of even numbers along the length of said second support that are different than said first set of sequential numbers.

20. The current monitoring system of claim 19 wherein said first configuration data and said second configuration data indicates said first support and said second support are in an end to end arrangement.

21. The current monitoring system of claim 20 wherein said first configuration data and said second configuration data indicates said first support and said second support are in a single row odd/even configuration.

\* \* \* \* \*

UNITED STATES PATENT AND TRADEMARK OFFICE
CERTIFICATE OF CORRECTION

| | | |
|---|---|---|
| PATENT NO. | : 9,778,290 B2 | Page 1 of 2 |
| APPLICATION NO. | : 15/185677 | |
| DATED | : October 3, 2017 | |
| INVENTOR(S) | : Eric Moon et al. | |

It is certified that error appears in the above-identified patent and that said Letters Patent is hereby corrected as shown below:

In the Specification

Column 4, Line 65: Delete "addition." and replace with --addition,--;

Column 6, Line 59: Delete "embedment" and replace with --embodiment--;

Column 8, Line 17: Delete "pane" and replace with --panel--;

Column 8, Line 38: Delete "board" and replace with --board,--;

Column 8, Line 43: Delete "board" and replace with --board,--;

Column 9, Line 29: Delete "402 If" and replace with --402. If--;

Column 9, Line 33: Delete "404 If" and replace with --404. If--;

Column 9, Line 36: Delete "406 If" and replace with --406. If--;

Column 9, Line 39: Delete "408 If" and replace with --408. If--;

Column 9, Line 52: Delete "410 If" and replace with --410. If--;

Column 9, Line 56: Delete "412 If" and replace with --412. If--;

Column 9, Line 59: Delete "414 If" and replace with --414. If--;

Column 9, Line 63: Delete "416 If" and replace with --416. If--;

Column 10, Line 9: Delete "420 If" and replace with --420. If--;

Signed and Sealed this
Twenty-ninth Day of October, 2019

Andrei Iancu
*Director of the United States Patent and Trademark Office*

CERTIFICATE OF CORRECTION (continued)
U.S. Pat. No. 9,778,290 B2

Column 10, Line 12: Delete "422 If" and replace with --422. If--;

Column 10, Line 15: Delete "424 If" and replace with --424. If--;

Column 10, Line 19: Delete "426 If" and replace with --426. If--;

Column 10, Line 32: Delete "430 If" and replace with --430. If--;

Column 10, Line 35: Delete "432 If" and replace with --432. If--;

Column 10, Line 38: Delete "434 If" and replace with --434. If--;

Column 10, Line 42: Delete "436 If" and replace with --436. If--; and

Column 11, Line 37: Delete "provided" and replace with --provide--.